United States Patent
Chew

(10) Patent No.: US 7,106,229 B1
(45) Date of Patent: Sep. 12, 2006

(54) GAIN ERROR CORRECTION IN AN ANALOG-TO-DIGITAL CONVERTER

(75) Inventor: Mark Chew, La Jolla, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 11/217,155

(22) Filed: Aug. 31, 2005

Related U.S. Application Data

(60) Provisional application No. 60/691,964, filed on Jun. 16, 2005.

(51) Int. Cl.
*H03M 1/06* (2006.01)

(52) U.S. Cl. .................................. 341/118; 341/172

(58) Field of Classification Search ............... 341/118, 341/150, 172
See application file for complete search history.

(56) References Cited

U.S. PATENT DOCUMENTS

| | | | | |
|---|---|---|---|---|
| 5,012,247 A | * | 4/1991 | Dillman | 341/172 |
| 5,852,415 A | * | 12/1998 | Cotter et al. | 341/120 |
| 6,433,712 B1 | * | 8/2002 | Ohnhaeuser et al. | 341/118 |
| 6,870,496 B1 | * | 3/2005 | Krymski et al. | 341/172 |
| 2003/0063026 A1 | * | 4/2003 | Nandy | 341/172 |

* cited by examiner

*Primary Examiner*—Howard L. Williams
(74) *Attorney, Agent, or Firm*—Philip Wadsworth; Charles D. Brown; Timothy F. Loomis

(57) ABSTRACT

An error correction circuit for use with an analog-to-digital converter (ADC) comprising a first switch and a second switch and correction capacitor arranged in parallel and coupled to the first switch. The second switch is also coupled to ground and the correction capacitor is also coupled to a reference voltage wherein the first switch is arranged to be active during a hold mode of the ADC and the second switch is arranged to be active during a sample phase of the ADC.

2 Claims, 4 Drawing Sheets

GAIN ERROR CORRECTION IN AN ANALOG-TO-DIGITAL CONVERTER

RELATED APPLICATIONS

This application claims the benefit of U.S. Provisional Application No. 60/691,964 filed Jun. 16, 2005 and is related to application: "GAIN ERROR CORRECTION," U.S. patent application Ser. No. 11/217,154; and application: "OFFSET ERROR CORRECTION," U.S. patent application Ser. No. 11/217,156; filed concurrently herewith.

BACKGROUND

I. Field

The present disclosure generally relates to gain error correction. More particularly, the disclosure relates to offset and gain error correction in a discrete time circuit, such as an Analog-to-Digital converter (ADC).

II. Description of Related Art

Normally, in any ADCs, there is a systematic offset error at zero-code and a systematic gain error at full-scale-code. Since these errors are systematic, they can be calibrated after the first round of testing before mass-production of the ADCs.

Such errors have in the past been corrected through use of a look-up table including correction codes or through the use of correlated double-sampling. These methods involve more circuitry and demand more power. With ADC's being utilized in smaller, battery-powered environments, such as a wireless phone, PDA or laptop computer, minimization of circuitry and power conservation to preserve battery life is more important.

Accordingly it would be advantageous to provide an improved system for correcting offset errors.

SUMMARY

A system and method of correcting gain error is disclosed that includes charge-sharing between capacitors.

In a particular embodiment, a system and method of correcting gain error can include discharging a correction capacitor during a sampling phase by turning its parallel switch on. Then during the hold phase, connecting it to a sample-and-hold capacitor so as to result in charge-sharing between the sample-and-hold capacitor and the correction capacitor.

In one particular embodiment, an error correction circuit for use with an analog-to-digital converter (ADC) is provided comprising a first switch and a second switch and correction capacitor arranged in parallel and coupled to the first switch. The second switch is also coupled to ground and the correction capacitor is also coupled to a reference voltage wherein the first switch is arranged to be active during a hold mode of the ADC and the second switch is arranged to be active during a sample phase of the ADC.

An advantage of one or more embodiments disclosed herein can include effective gain error correction without high power consumption.

Other aspects, advantages, and features of the present disclosure will become apparent after review of the entire application, including the following sections: Brief Description of the Drawings, Detailed Description, and the Claims.

BRIEF DESCRIPTION OF THE DRAWINGS

The aspects and the attendant advantages of the embodiments described herein will become more readily apparent by reference to the following detailed description when taken in conjunction with the accompanying drawings wherein.

DETAILED DESCRIPTION

Figure 1:
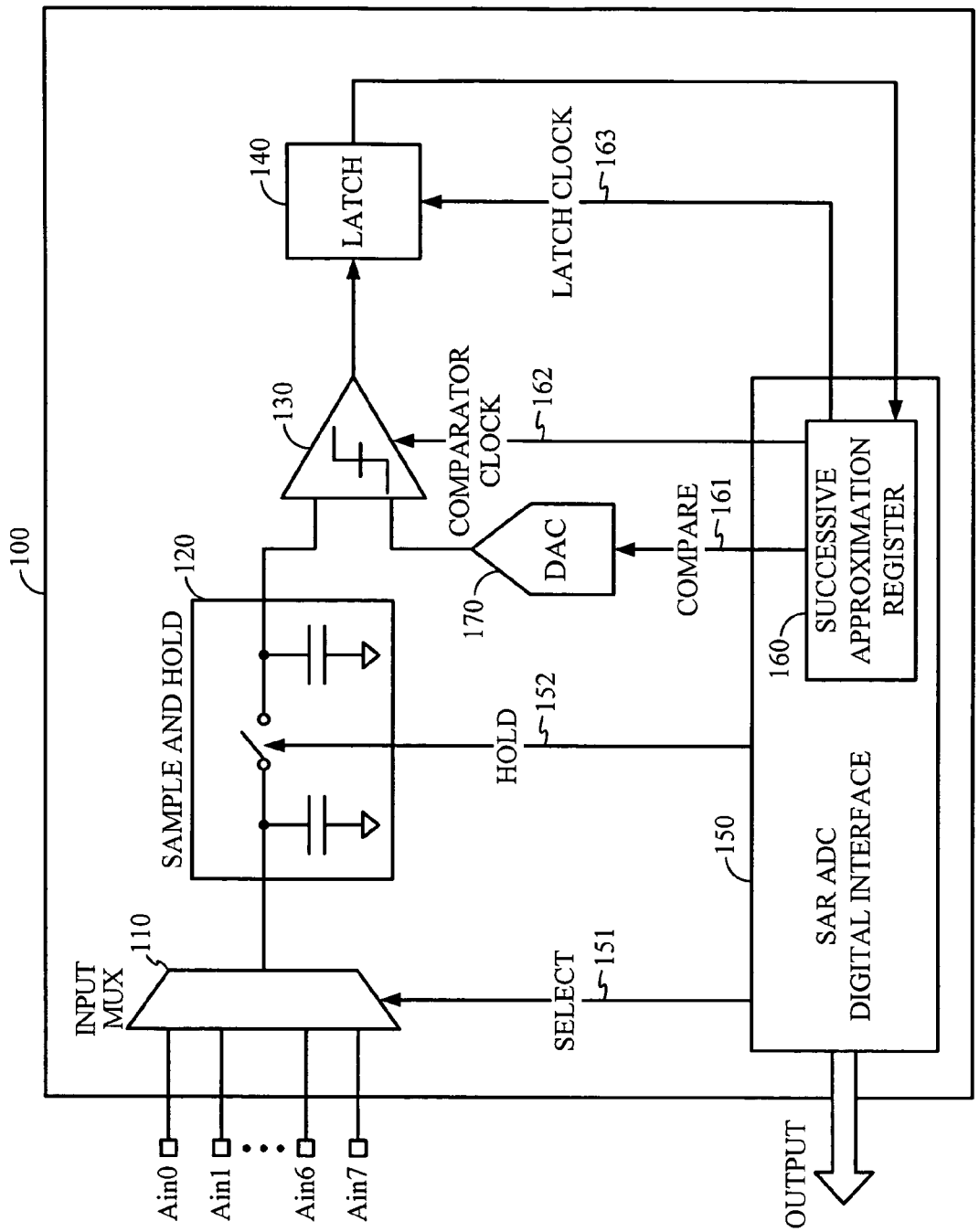
FIG. 1 is a general diagram of an exemplary Successive-Approximation-Register ADC (SAR-ADC) of the prior art.

FIG. 1 shows an SAR-ADC 100 of the prior art. ADC 100 samples the analog input signal through the input mux 110 onto a sample-and-hold circuit 120. Then a comparison is done between reference voltages (from the Digital-to-Analog converter (DAC) 170) and the sampled input signal by comparator 130. The output of comparator 130 is passed onto latch 140 which provides a latched signal to successive approximation register 160 which may be a part of digital interface 150. Digital interface 150 outputs the resulting digital bit. Based on the comparison result of comparator 130, a new reference voltage is created by the DAC 170 and second-comparison is done to generate a second bit. This operation continues until all of the desired bits are obtained. Digital interface 150 controls this operation by providing a select signal 151 to input mux 110 and a hold signal 152 to sample-and-hold circuit 120. Digital interface 150 also may comprise a successive approximation register 160 that generates a compare signal 161, a comparator clock 162 and a latch clock 163. Compare signal 161 is fed to DAC 170 (for providing the reference voltages to comparator 130). Comparator clock 162 is used to time comparator 130 and latch clock 163 is used to time latch 140.

Figure 2:
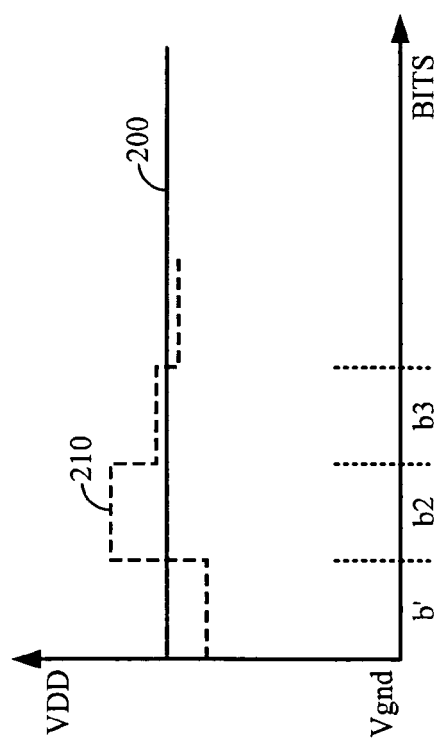
FIG. 2 is a diagram illustrating an exemplary operation of an SAR-ADC of the prior art.

The input voltage and reference voltage generated by the SAR-ADC of FIG. 1 is shown in FIG. 2. The sampled input voltage is represented by solid line 200, while the dashed line 210 represents the reference voltages. As shown in FIG. 2, bits are extracted from the SAR-ADC of FIG. 1 in the order starting from Most-Significant-Bit to Least-Significant-Bit until all the bits are obtained. As represented in this graph, VDD is the full-scale voltage and Vgnd is the zero-scale voltage.

Referring back to FIG. 1, there are various elements that can directly contribute to the offset and gain error, such as (comparator 130, DAC 170, and sample-and-hold circuit 120). The root-causes of the errors can be categorized as mismatches on the comparator 130, charge-injection of the sample-and-hold circuit 120 switches, reference-coupling from DAC 170 to sample-and-hold circuit 120 (kickback noise), and parasitic-elements on DAC 170. These errors are systematic and can be calibrated after system-characterization.

Figure 3:
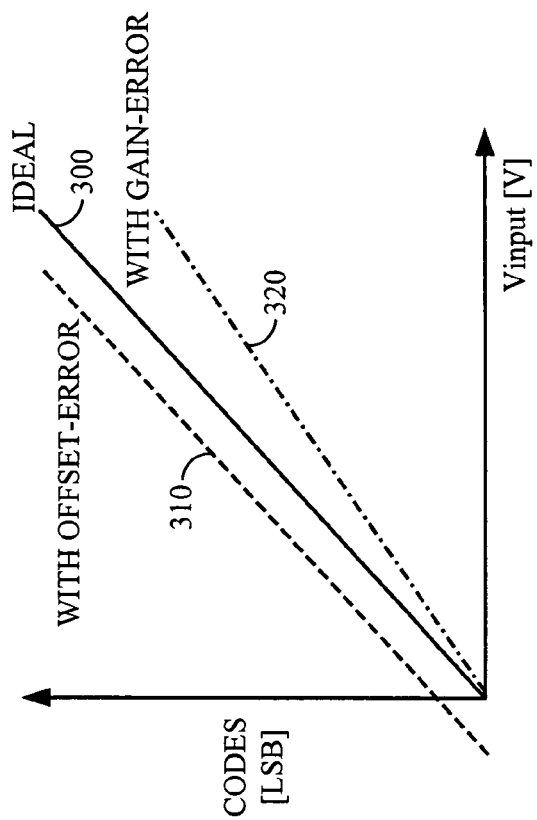
FIG. 3 is a diagram depicting exemplary offset error and gain error introduced by an SAR-ADC of the prior art.

A graph depicting an example of the effects of offset and gain errors on the converted code is represented in FIG. 3. As can be seen, line 300 represents the ideal output of the ADC where the converted code matches the input signal. Offset error causes the ideal line to shift, represented by line 310. Gain error causes a change in the slope of the line as represented by line 320. One or both of these types of errors can exist.

Figure 4:
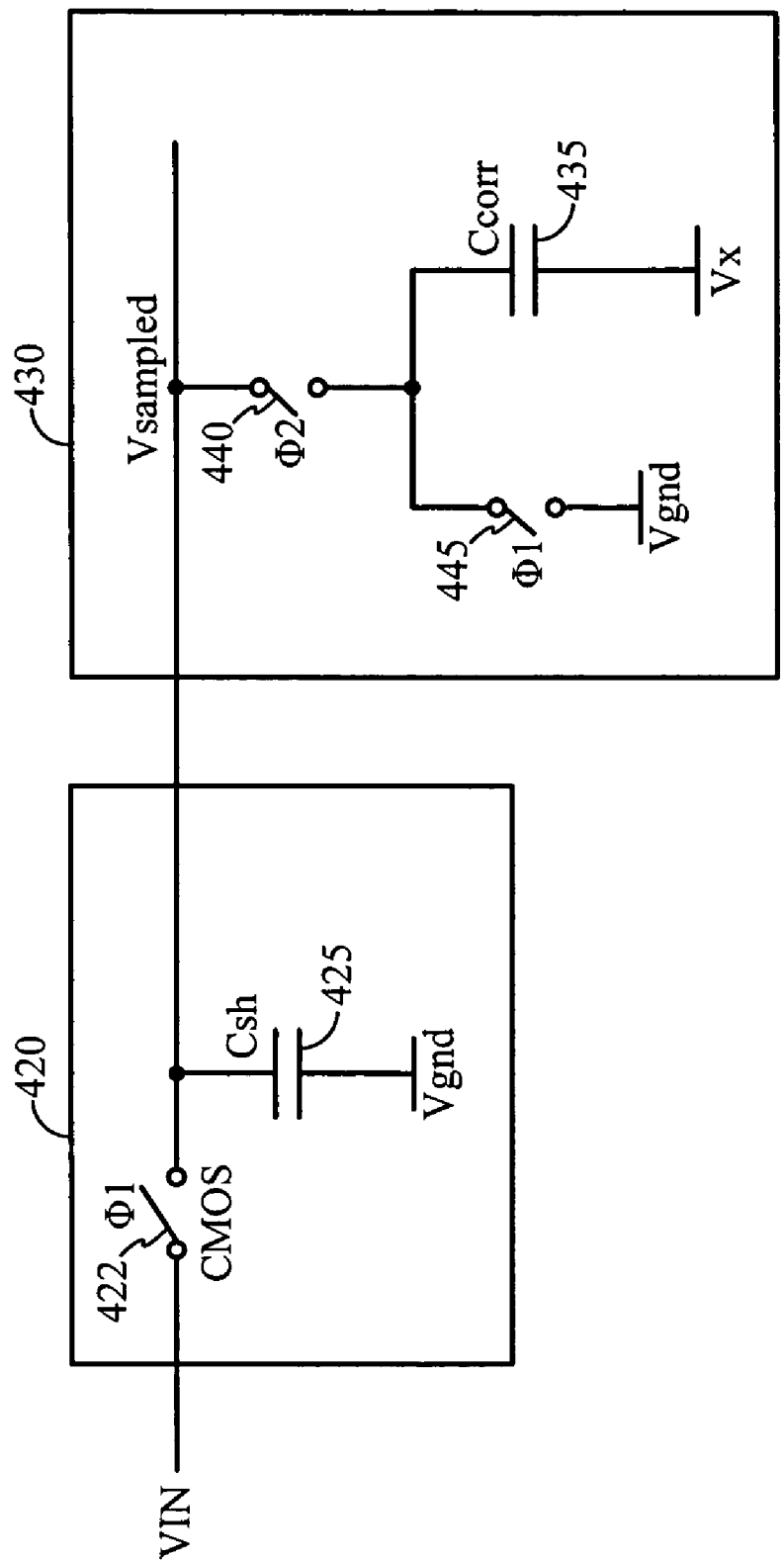
FIG. 4 is diagram illustrating an exemplary embodiment of a gain error correction circuit.

Referring now to FIG. 4, an exemplary embodiment of a gain error correction circuit 430 along with a sample-and-hold circuit 420 is shown.

Sample-and-hold circuit 420 comprises sample-and-hold switch 422 and sample-and-hold capacitor 425 (Csh). Other components of sample-and-hold circuit 420 are not shown. The output of sample-and-hold circuit 420 is fed to error correction circuit 430. Sample-and-hold switch 422, which may be a CMOS switch for example, controls the sampling operation. Basically, when Φ1 is active high, sample-and-hold switch 422 is active (closed) and the input signal is passed to the top plate of sample-and-hold capacitor 425 and correction capacitor 435 of error correction circuit 430. When sample-and-hold switch 422 is opened, the sampling operation is completed and the hold operation starts. Sample-and-hold capacitor 425 may be comprised of a plurality of unit-sized capacitors (Cu), for instance, two hundred Cu's.

Gain error correction circuit 430 comprises first switch 435, second switch 440 and correction capacitor 435 (Ccorr). As is shown, the output of sample-and-hold circuit 420 is coupled to first switch 440. First switch 440 is activated when Φ2 is active high and thus, the hold operation is in progress. First switch 440 is also coupled to a parallel arrangement of second switch 445 and correction capacitor 435. Second switch 445 is activated when Φ1 is active high and thus, the sample operation is in progress. The lower plate of correction capacitor 435 is coupled to a reference voltage Vx.

Correction capacitor 435 is discharged during the sample phase of the ADC by activating second switch 445. During the hold phase, it is connected to sample-and-hold capacitor 425 through first switch 440. This will result charge-sharing between sample-and-hold capacitor 425 and correction capacitor 435. The final voltage at the top plate will be Vsampled=VIN*Csh/(Csh+Ccorr). Because error correction circuit 430 introduces a factor multiplied by input voltage, it can effectively cancel out gain error. If it is desirable, the effective value of Ccorr can be made programmable, either by switching capacitors (not shown) in parallel with Ccorr or by changing the voltage at Vx.

Figure 5:
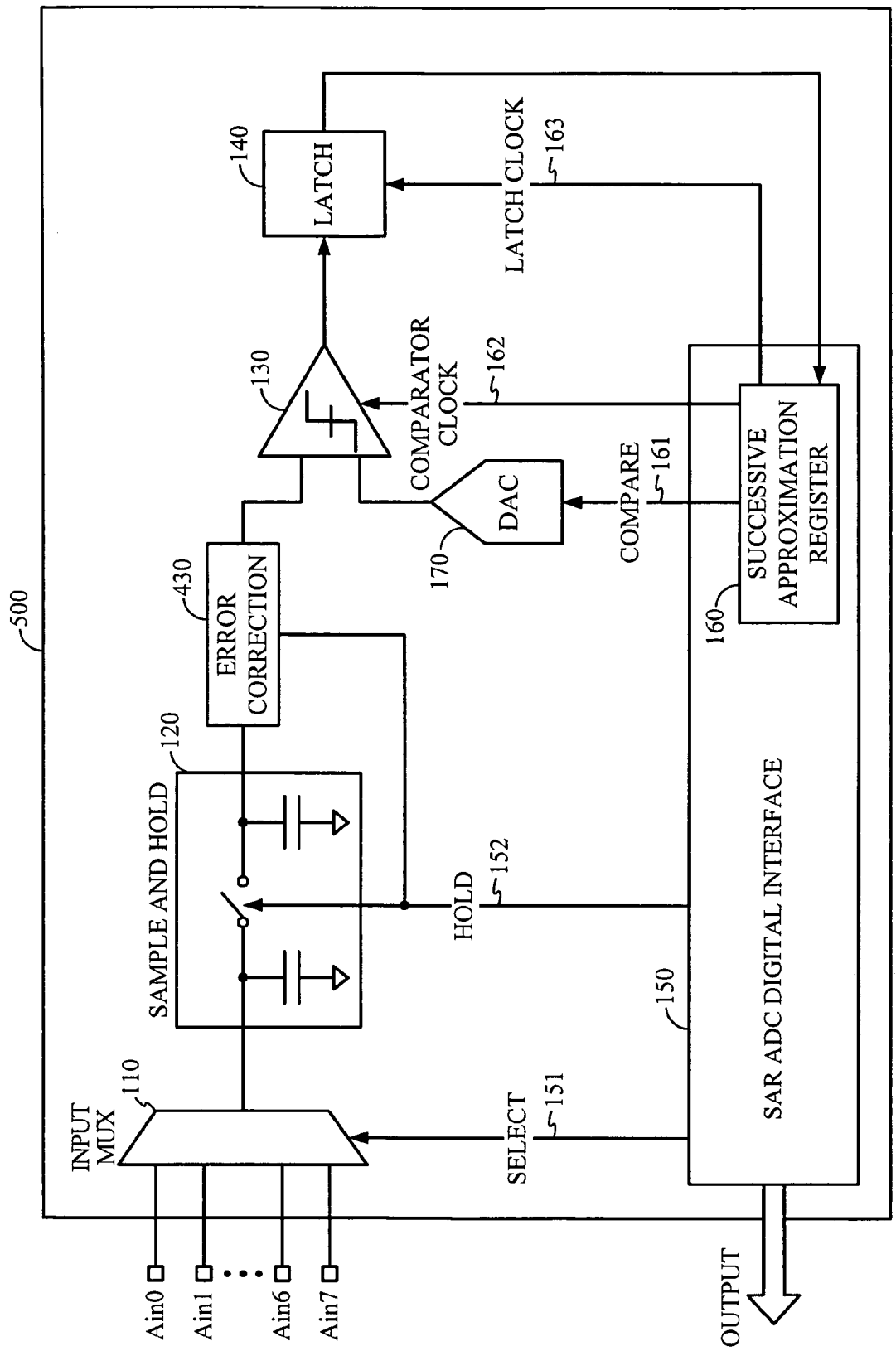
FIG. 5 is diagram illustrating an exemplary embodiment of an ADC having a gain error correction circuit of FIG. 4.

FIG. 5 illustrates an exemplary embodiment of an ADC having an error correction circuit of FIG. 4. Elements of ADC 500 are similar to those of ADC 100 of FIG. 1, however, error correction circuit 430 is included between sample-and-hold circuit 120 and comparator 140.

With the configuration of structure disclosed herein, the systems and methods described herein provides ways to correct gain error within an ADC. As such, the need for gain error correction is obviated.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features as defined by the following claims.

What is claimed is:

1. An error correction circuit for use with an analog-to-digital converter (ADC) comprising:
   a first switch;
   a second switch and a correction capacitor arranged in parallel and coupled to the first switch, the second switch also coupled to ground and the correction capacitor also coupled to a reference voltage;
   wherein the first switch is arranged to be active during a hold mode of the ADC and the second switch is arranged to be active during a sample phase of the ADC.

2. An analog-to-digital converter (ADC) comprising:
   a sample-and-hold circuit;
   a comparator coupled to the sample-and-hold circuit; and
   an error correction circuit coupled to the sample-and-hold circuit and the comparator, the error correction circuit comprising
   a first switch;
   a second switch and a correction capacitor arranged in parallel and coupled to the first switch, the second switch also coupled to ground and the correction capacitor also coupled to a reference voltage;
   wherein the first switch is arranged to be active during a hold mode of the ADC and the second switch is arranged to be active during a sample phase of the ADC.

* * * * *